(12) United States Patent
Yamaguchi et al.

(10) Patent No.: US 6,762,422 B2
(45) Date of Patent: Jul. 13, 2004

(54) ANALYZER/OBSERVER

(75) Inventors: Hironaru Yamaguchi, Yokohama (JP); Hidefumi Ibe, Yokohama (JP); Naoki Yamagami, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/148,513
(22) PCT Filed: Nov. 29, 2000
(86) PCT No.: PCT/JP00/08398
§ 371 (c)(1), (2), (4) Date: Sep. 24, 2002
(87) PCT Pub. No.: WO01/40735
PCT Pub. Date: Jun. 7, 2001

(65) Prior Publication Data
US 2003/0116720 A1 Jun. 26, 2003

(30) Foreign Application Priority Data
Dec. 1, 1999 (JP) .......................... 11-341879

(51) Int. Cl.$^7$ .............................................. H01J 37/26
(52) U.S. Cl. ................... 250/491.1; 250/492.2; 250/492.3; 250/492.22
(58) Field of Search ........................ 250/491.1, 492.2, 250/492.22, 492.3

(56) References Cited
U.S. PATENT DOCUMENTS
6,407,373 B1 * 6/2002 Dotan .................... 250/201.3
6,667,483 B2 * 12/2003 Kobaru et al. .......... 250/492.2

* cited by examiner

Primary Examiner—John R. Lee
Assistant Examiner—Paul M. Gurzo
(74) Attorney, Agent, or Firm—Townsend and Townsend and Crew LLP

(57) ABSTRACT

On a sample base 1 disposed within a vacuum container is provided a scale S(1)... S(N), where in an actual distance of the sample base is monitored by observing the scale trough an optical system for exclusive use thereof, which can catch it within a field of view.

With this, it is possible to position a foreign body, as a target of analysis, which is analyzed or observed by a first analysis/observation device, so that it necessarily falls within a field of view of a second analysis/observation device, thereby realizing quick and automatic delivery of the samples when observing the foreign body on the sample by plural numbers of the devices.

9 Claims, 6 Drawing Sheets

ANALYZER/OBSERVER

TECHNICAL FIELD

The present invention relates to an apparatus for use of conducting analysis and observation upon a target, and in particular relates to a means for conducting transfer and positioning of a sample between plural numbers of analysis devices and observation devices (hereinafter, being called by "analysis/observation devices"), in an analysis and observation apparatus comprising plural numbers of the analysis/observation devices, such as an electron microscope, a secondary ion mass spectrometer, a micro-laser mass spectrometer, etc., targeting a fine foreign body or a contamination portion, being necessary for an improvement in a yield rate of semiconductor devices, such as, a memory, a LSI including an ASIC or the like, a magnetic disc unit, and a liquid crystal, and so on.

BACKGROUND ART

In recent years, accompanying with an improvement in the integrity of the semiconductor devices, even a fine foreign body of sub-micron order or/and a very small amount of contaminant of several atomic layers comes up to a cause of defects. For analysis of those defects, it is necessary to analyze a size and a shape of the foreign body and contaminant, as well as, the composition and ingredient thereof. For the observation of such the fine foreign body, conventionally, an electron microscope is used. Also, as a technology or method for analyzing the fine foreign body with high sensitivity are developed a secondary ion mass spectrometer and a micro-laser mass spectrometer, in which ions generated by irradiating charged particles or a laser beam upon a fine portion on the sample are analyzed.

By the way, for investigating the source of the foreign body, in many cases, it is necessary to decide or determine by combining data obtained from those plural numbers of analysis/observation devices over all. And, for improving the quantitive analyzing of the micro-laser mass spectrometer, it is necessary to know the condition of evaporation upon the surface of the sample due to the irradiation of a laser beam. Also for this reason, it is necessary to combine the micro-laser mass spectrometer with the electron microscope, thereby achieving the observation with high level.

An example, in which the electron microscope, the secondary ion mass spectrometer and the micro-laser mass spectrometer are combined with an ion-beam processing apparatus, is described in Japanese Patent Laying-Open No. Hei 10-223168 (1998).

In this conventional apparatus, there are mentioned a case where an electron beam of the electron microscope and a laser beam of the micro-laser mass spectrometer are irradiated at the same position, and a case where they are irradiated at the different positions. In the former case, since the lens systems of the electron microscope and the micro-laser mass spectrometer must be disposed coaxially, the performances are restricted in the observation and the analysis.

Then, for the purpose of bringing the performances of observation and analysis thereof up to the maximum, if adopting the structure of the later, the sample must be moved between the electron microscope and the micro-laser mass spectrometer, therefore there occurs a necessity of bringing the accuracy in positioning of a sample base to be high.

DISCLOSURE OF THE INVENTION

As was shown exemplarily in the conventional art mentioned above, when conducting the observation through the electron microscope and the analysis through the micro-laser mass spectrometer upon the same sample, continuously, a means comes to be necessary for transfer the sample between that electron microscope and that micro-laser mass spectrometer. Judging from the sizes of the devices, in general, the distance of movement between them is several tens centimeter (cm), however, as was described in the conventional art mentioned above, the distance of movement of a sample stage and the accuracy of positioning cannot cope with each other. Then, for the purpose of improving the accuracy of positioning, according to the conventional art mentioned above, a rough-movement mechanism and a fine-movement mechanism are combined.

However, the conventional art mentioned above does not comprises a means for measuring the sample position directly. Also, since the sample is transferred within a vacuum chamber, it is also difficult to measure the distance of movement through watching the sample base from an outside.

For this reason, when positioning, it is necessary for a person who makes a measurement to search the foreign bodies while observing an image of the sample on the electron microscope or the micro-laser mass spectrometer. In particular, due to an error of a rough-movement stage, it takes a very long time when the foreign body lies in an outside of a field of vision.

An object, according to the present invention, in an analysis and observation apparatus which comprises plural numbers of analysis/observation means therein, is to provide the analysis and observation apparatus, in which a target to be analyzed and/or observed on said sample can be positioned, so that it falls within a field of vision of the analysis/observation means at the destination of the movement, when the sample is transferred between the plural numbers of analysis/observation means.

However, according to the present invention, the field of vision of the analysis/observation means indicates a field of vision of analysis/observation by said means itself, or a two (2)-dimensional area or region, which can be observed through an optical observation means to be used for setting an analysis/observation region cooperating with said means, and for example, it indicates the field of vision of a scanning-type electron microscope, or the field of vision of a camera for use in an identification of analysis position equipped on the micro-laser mass spectrometer.

And, for dissolving such the problem mentioned above, in the analysis and observation apparatus comprising the analysis/observation means in plural numbers thereof, wherein there is provided a positioning means for positioning a specific position on said sample, upon which analysis or observation was made by a certain one of the analysis/observation means, into a field of view of other analysis/observation means.

Figure 5A:
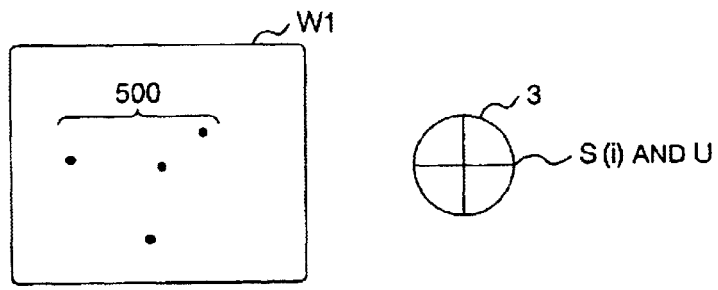
FIG. 5(a) is a view for explaining an image (at the left-hand side), which can be observed by using the analysis/ observation apparatus according to the first embodiment, and an image (at the right-hand side), which can be observed by using an optical system for use-of scale observation, before movement of a sample.
Figure 5B:
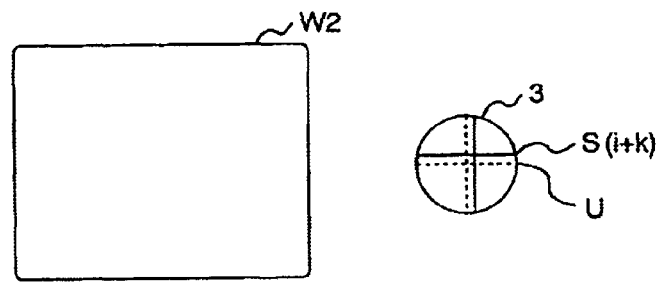
Figure 5C:
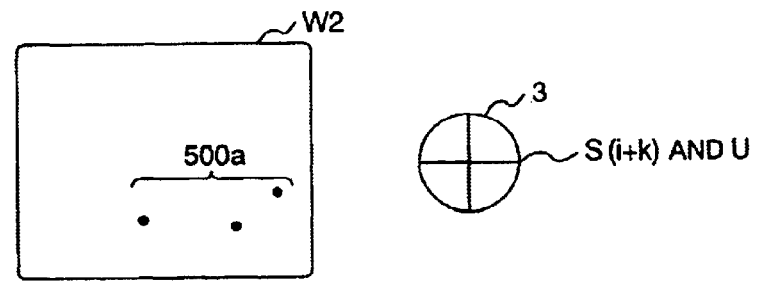
Figure 5D:
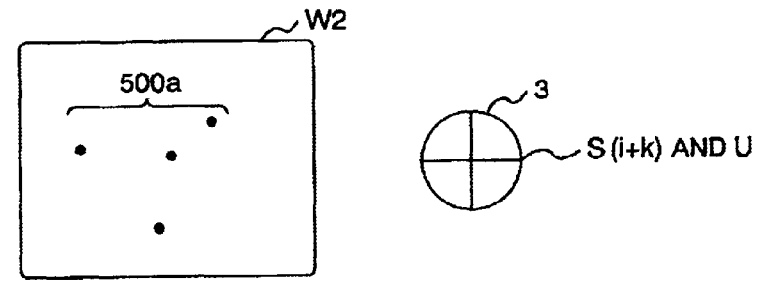
Figure 6:
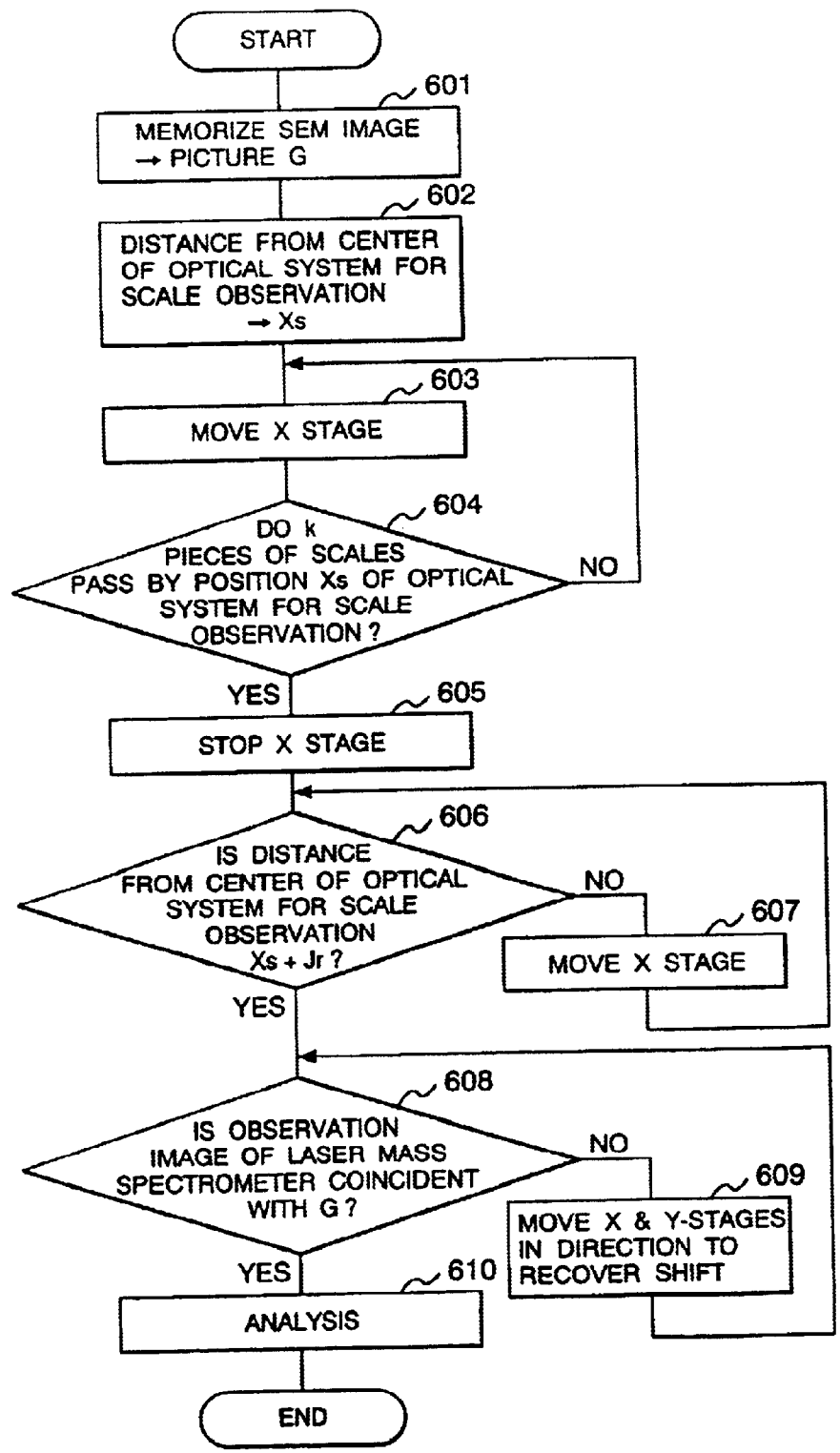

FIG. 5(b) is an example of an explanatory view for showing an-image (at the left-hand side), which can be observed by using the analysis/observation apparatus according to the first embodiment, and an image (at the right-hand side), which can be observed by using an optical system for use of scale observation, during movement of the sample;

FIG. 5(c) is other example of an explanatory view for showing an image (at the left-hand side), which can be observed by using the analysis/observation apparatus according to the first embodiment, and an image (at the right-hand side), which can be observed by using an optical system for use of scale observation, during movement of the sample;

FIG. 5(d) is a view for explaining an image (at the left-hand side), which can be observed by using the analysis/observation apparatus according to the first embodiment, and an image (at the right-hand side), which can be observed by using the optical system for use of scale observation, after movement of the sample; and FIG. 6 is a flowchart for showing an example of operations for positioning the sample, according to a fifth embodiment.

BEST MODE FOR CARRYING OUT THE INVENTION

In a first embodiment of the present invention, on a stage for use of moving a sample mounted thereon is provided a scale, divisions of which are marked at a distance narrower than a field of view at a destination of movement of an analysis/observation means. Further, when moving the sample between analysis/observation means, a distance of movement of the sample is monitored by counting the scale divisions passing by, through an optical system for scale observation, which is fixedly mounted on the moving stage for use of movement.

According to the present invention, by conducting positioning with using this monitoring result, a target on the sample falls within a field of view of the analysis/observation means, at the destination of movement thereof.

Hereinafter, explanation will be given on an embodiment in more details, by referring to the drawings.

Figure 1:
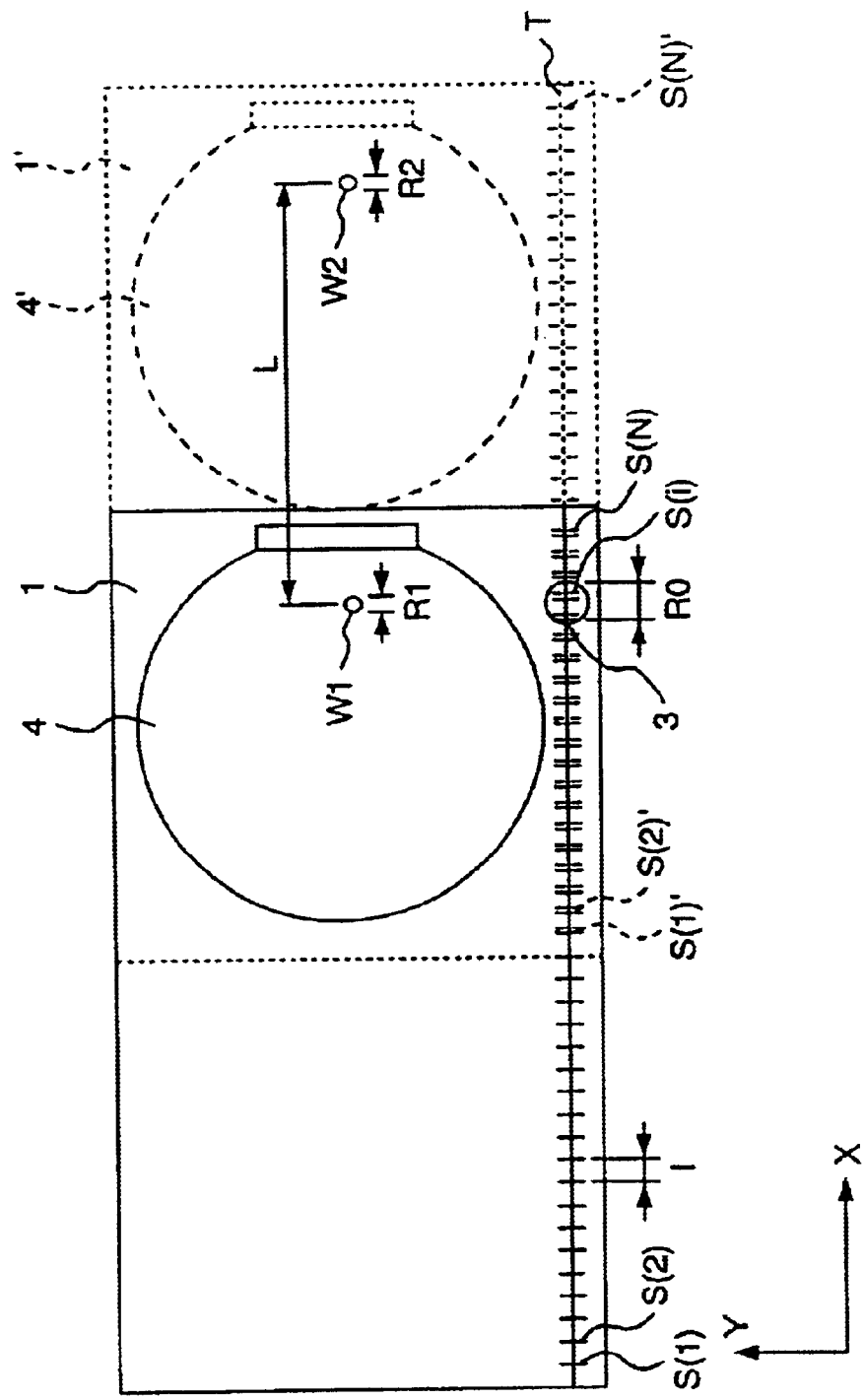
FIG. 1 is an explanatory view for explaining a sample base according to a first embodiment.

FIG. 1 shows a first embodiment of the present invention. In FIG. 1, a reference numeral 1 indicates a sample base, $S(1), S(2)...S(N)$ the scale divisions, I the distance between the scale divisions, 3 a field of view of an optical system for use of scale observation, R0 width of the field of view 3, W1 and W2 fields of views of a first and a second analysis/observation means, respectively, R1 and R2 widths of the fields of views W1 and W2, respectively, and 4 a sample. Solid lines and broken lines indicate positions of the sample base, when analysis or observation is made by the first and the second analysis/observation means, respectively.

Also, each reference numerals and/or marks attached with an apostrophe (or, a prime "'") correspond to the position of the sample base depicted by the broken lines. L indicates a distance between the two (2) analysis/observation devices on optical axes thereof. X indicates a direction of a straight line connecting between the optical axes of the (2) analysis/ observation devices, and Y a direction being orthogonal thereto. Hereinafter, explanation will be given by listing up an example of a case, where first the analysis or the observation is made on the sample through a first analysis/observation device, and thereafter the sample is moved and is positioned, so that a specific position on the sample where the analysis or the observation was made through the first analysis/observation device falls within the field of view of a second analysis/observation device.

In the present embodiment, the size R0 of the field of view of the optical system for scale observation and the distance I of the scales are in the following relationship:

$$R0 > I \qquad \text{(Eq. 1)}$$

From this, at least one of the scale divisions can be seen always in the field of view 3. It is assumed that one of the scale divisions, which can be seen at the most left-hand side (or one the most right-hand side) within the filed of view 3, is $S(i)$, when making the analysis or observation upon a foreign body as a target on the sample through the first analysis/observation device.

For analyzing or observing the foreign body through the second analysis/observation device, it is necessary to move the sample base 1 by the distance L mentioned above. The L can be expressed by a relationship between the distance of scale divisions I and the following equation:

$$L = kI + \alpha \qquad \text{(Eq. 2)}$$

$$0 \leq \alpha < I$$

where, "k" indicates an integer and a count number of the scale divisions counted up from beginning of the movement, and "α" a component of distance, being less than the distance I of scales.

Namely, for moving the foreign body as the target of analysis or observation from the first analysis/observation device into the vicinity of the optical axis of the second analysis/observation device, it is sufficient to ascertain a fact that k pieces of the scale divisions pass by at the position where the scale division $S(i)$ was located before movement of the sample, by using the optical system for scale observation.

Also, according to the present embodiment, both the sizes of the fields of views W1 and W2 of the first and the second analysis/observation devices are assumed to be larger than a resolving power of the optical system for scale observation. Thus, when assuming that the resolving power of the optical system for scale observation is R, the following can be established:

$$R < R1 \text{ and } R < R2 \qquad \text{(Eq. 3)}$$

Then, the equation (Eq. 2) mentioned above is rewritten as follows:

$$L = kI + jR + \beta \qquad \text{(Eq. 4)}$$

$$-R/2 < \beta < R/2$$

where, "j" indicates an integer, and "β" a component of distance, being less than the resolving power R of the optical system for use of scale observation.

From this, for positioning the foreign body within the fields of views W1 and W2 of the first and the second analysis/observation devices, it is sufficient to ascertain a fact that the movement is made further by the distance of jR from the position where the scale $S(i+k)$ was detected, by using the optical system for scale observation.

Also, for positioning the foreign body at a position of measurement of the second analysis/observation devices, with further high accuracy, it is sufficient to bring the position of the foreign body to be coincident with, by controlling the positioning operation of the sample base, via feedback of the difference, which can be obtained by comparison between the foreign bodies appearing on the two (2) images obtained from the second analysis/observation device and the first analysis/observation device, in a image processing device or the like.

Also, due to such the operations as was explained in the above, i.e., via automatization in monitoring on the distance of movement of the sample base by using marks of the scale divisions, or in positioning by using the images obtained from the analysis/observation devices before and after the movement thereof, it is possible to conduct the positioning of the samples, accurately and at high speed, when transferring the samples between plural numbers of the analysis/observation devices.

A second embodiment of the present invention will be explained by referring to FIGS. 2 and 3.

An analysis and observation apparatus, according to the present embodiment, comprises a scanning-type electron microscope (SEM) and a micro-laser mass spectrometer as the analysis/observation devices, wherein observation and/or analysis is made upon the same target on the sample by moving the sample between the both devices.

Figure 2:
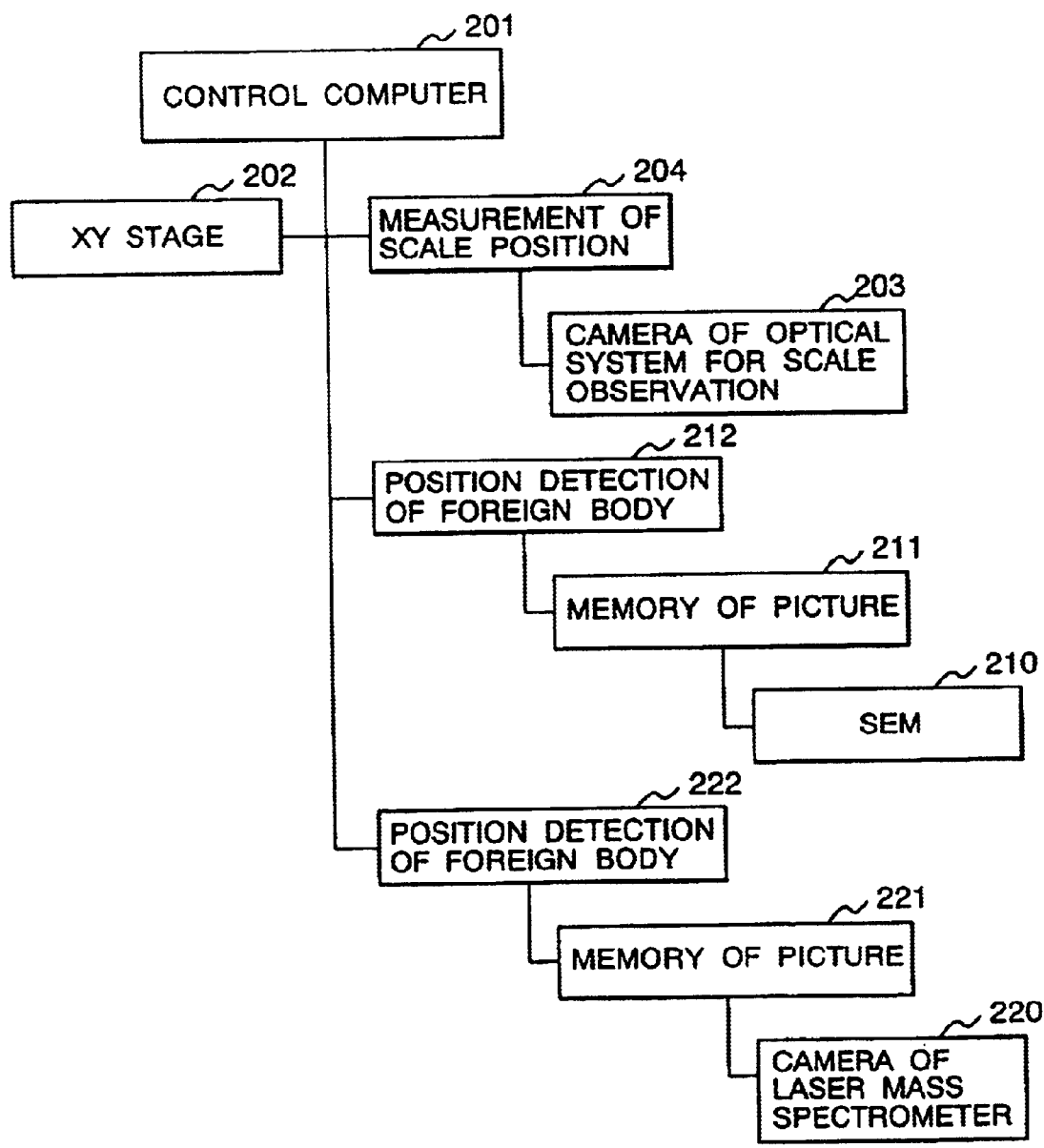
FIG. 2 is a block diagram for showing the structure of an apparatus according to a second embodiment.

The analysis and observation apparatus according to the present embodiment, for example, as shown in FIG. 2, comprises: an XY stage 202 for moving the sample base 1, on which the sample is mounted; a camera 203 of an optical system for use of scale observation, which observes the scale divisions provided on the sample base 1; a measurement portion 204 for the scale position, which measures the scale division position by using a result of observation through the camera 203 of the optical system for use of scale observation; an electron microscope 210 for conducting microscopic observation of the target; an image memory portion 211 for memorizing the images or pictures obtained from the electron microscope; a detector portion 212 of foreign body for detecting the position of the foreign body as the target from the microscopic images or pictures memorized; a camera 220 for use in a micro-laser mass spectrometer, to be used for setting the position of analysis by the micro-laser mass spectrometer; an image memory portion 221 for memorizing the optical images or pictures obtained by the camera 220 for use in a micro-laser mass spectrometer; a detector portion 222 of foreign body for detecting the position of the foreign body as the target from the optical images or pictures memorized in the image memory portion 221; and a control computer 201 for conducting the positioning of the XY stage 202 by using the results of measurement and detection obtained from the measurement portion 204 for the scale position, and the detector portions 212 and 222 of foreign body.

Figure 3:
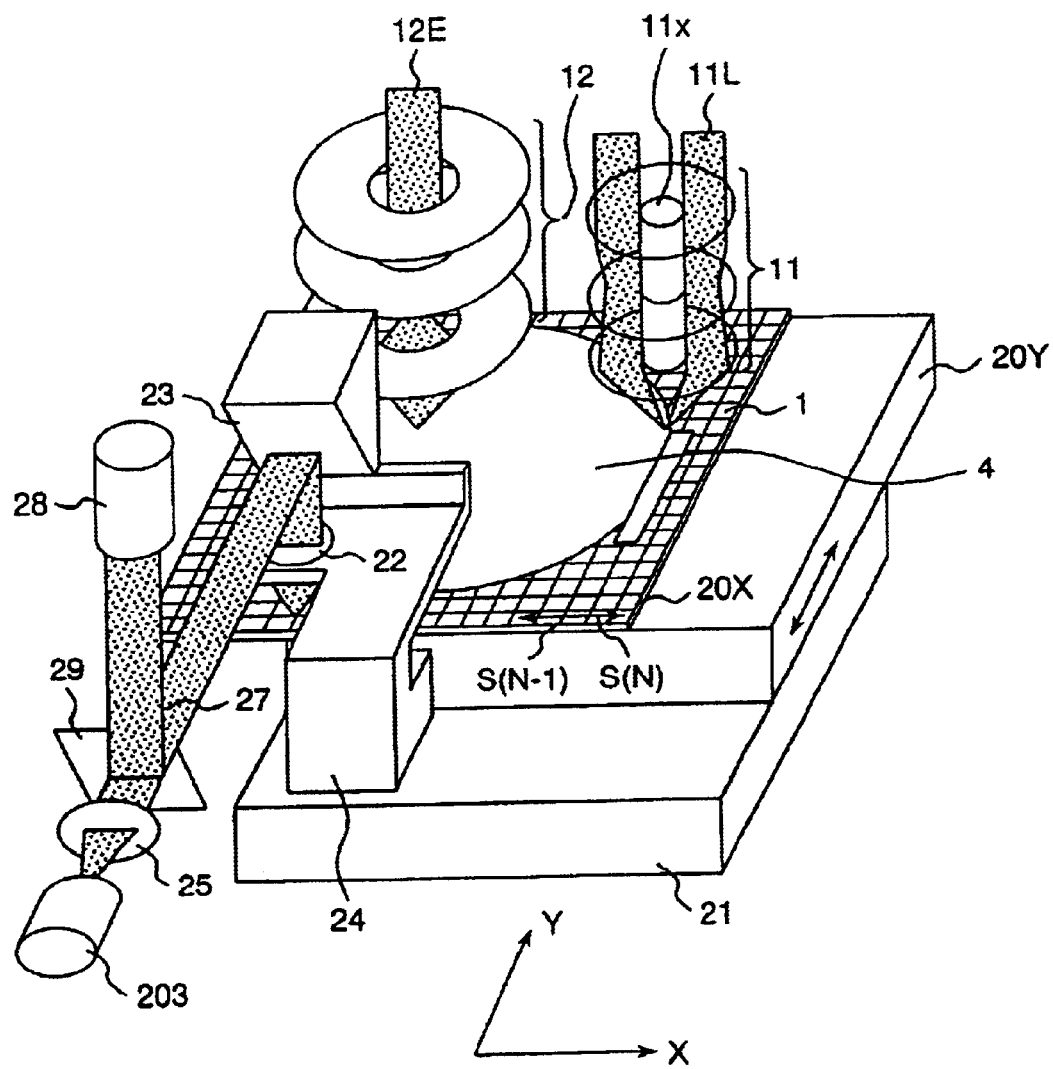
FIG. 3 is a perspective view for showing a principle portion of the structure of that apparatus shown in FIG. 2.

An example of the structure of the apparatus according to the present embodiment will be shown in FIG. 3, in more details thereof. In FIG. 3, a reference numeral 1 indicates a sample base, S(1), S(2) . . . S(N) the scale divisions, 4 a sample, 11 an objective lens for use in the micro-laser mass spectrometer, 11L a laser beam and an observation light beam of the micro-laser mass spectrometer, 11x a hole and an electrode for extracting ions, 12 an objective lens of the electron microscope, 12e an electron beam, 22 an objective lens for use of scale observation, 23 a mirror, 24 a holder jig, 25 an image-formation lens, 203 a camera of an optical system for use of scale observation, 27 an observation light, 28 an illumination light source, and 29 a semi-transparent mirror.

Also, in the present embodiment, the XY stage 202 in the FIG. 2 is built up with a stage 20X for use of X directional movement, a stage 20Y for use of Y direction movement, and a basement on which the stages 20X and 20Y for movement are mounted. In the present embodiment, the stage 20X for use of X directional movement is disposed between the stage 20Y for use of Y directional movement and the sample base 1. Further, according to the present embodiment, on this stage 20Y for use of Y directional movement is fixedly mounted the objective lens 22 for use of scale observation and the mirror 23, by means of the holder jig 24. Also, the image-formation lens 25 of the optical system for use of scale observation and the camera 203 of the optical system for use of scale observation are fixedly mounted in an inside or on an outside of a sample chamber of the vacuum atmosphere, in which is disposed a basement 21 mounting thereon the stages 20X and 20Y for use of movement.

According to the structure of the embodiment shown in the FIG. 3 mentioned above, the objective lens 22 for use of scale observation moves together with movement in the Y direction of the sample 4. Accordingly, the objective lens 22 for use of scale observation lies always above the scale divisions S(1)–S(N). But, the objective lens 22 for use of scale observation does not move when the sample 4 is moved in the X direction.

Therefore, according to the present embodiment, it is possible to monitor the distance of movement in the X direction by the optical system for use of monitor observation, thereby determining the position, so that the foreign body necessarily falls within the field of view W1 or W2 of the analysis/observation device at the destination of movement thereof.

Further, according to the present embodiment, the light emitted from the objective lens 22 for use of scale observation and reaching to the image-formation lens 25 is made to be a light beam being parallel along with the Y direction. Accordingly, it is always possible to make observation on the scale divisions S(1)–S(N) by means of the camera 203 of the optical system for use of scale observation, even if the objective lens 22 for use of scale observation is moved by the stage 20Y for use of Y directional movement.

With such the configuration, it is possible to dispose the camera 203 of the optical system for use of scale observation on an outside of a vacuum container, in which the sample is received, through a window, thereby a cheap camera can be applied for it, which is available on markets and is supposed to be used under the atmospheric pressure, in general. Also, there is no need to dispose electric parts and wiring within the vacuum container, then it is possible to lower ill influences upon the degree of vacuum.

As was explained in the above, according to the present embodiment, it is possible to achieve or conduct the delivery and the positioning of the samples in each and between the analysis devices and the observation devices, with high accuracy in position and at high speed.

A third embodiment of the present invention will be explained by referring to the FIG. 1 mentioned above.

In the analysis and observation apparatus according to the present embodiment, a line T is provided on the sample base 1 according to the first or the second embodiment mentioned above, extending in a direction (i.e., the X direction in the present embodiment), along which the sample base is moved, fitting to the scale divisions S(1)–S(N) thereon. Further, during the time when the sample is moved between the two (2) analysis/observation devices, the fluctuation of position in the Y direction of the line T is monitored by means of an optical observation device, such as, a video camera for use of scale observation, for example.

According to the present embodiment, in a case where the position thereof is shifted in the direction of Y-axis, accompanying with movement of the stage 20X for use of X-axial movement in the direction of X-axis, it is possible to compensate the shift by detecting that shift and feeding an amount of the shift detected back to the control of the stage 20Y for use in Y-axial movement, and also, to suppress ill influences due to that shift, as well.

According to the present embodiment, since it is possible to compensate the shift in the direction orthogonal to the direction of movement of the sample, an accuracy of position in delivery of the sample can be further increased. For example, with the second embodiment mentioned above, even in the cases where the micro-laser mass spectrometer and the electron microscope are shifted from the direction of X-axis, in the direction of movement, it is possible to protect from the ill influences, according to the present embodiment.

A fourth embodiment of the present invention will be explained by referring to the FIG. 4.

In the analysis and observation apparatus according to the present embodiment, an improvement on accuracy in positioning of the sample is obtained by using a reference scale in the analysis and observation apparatus, according to the second embodiment mentioned above.

Figure 4:
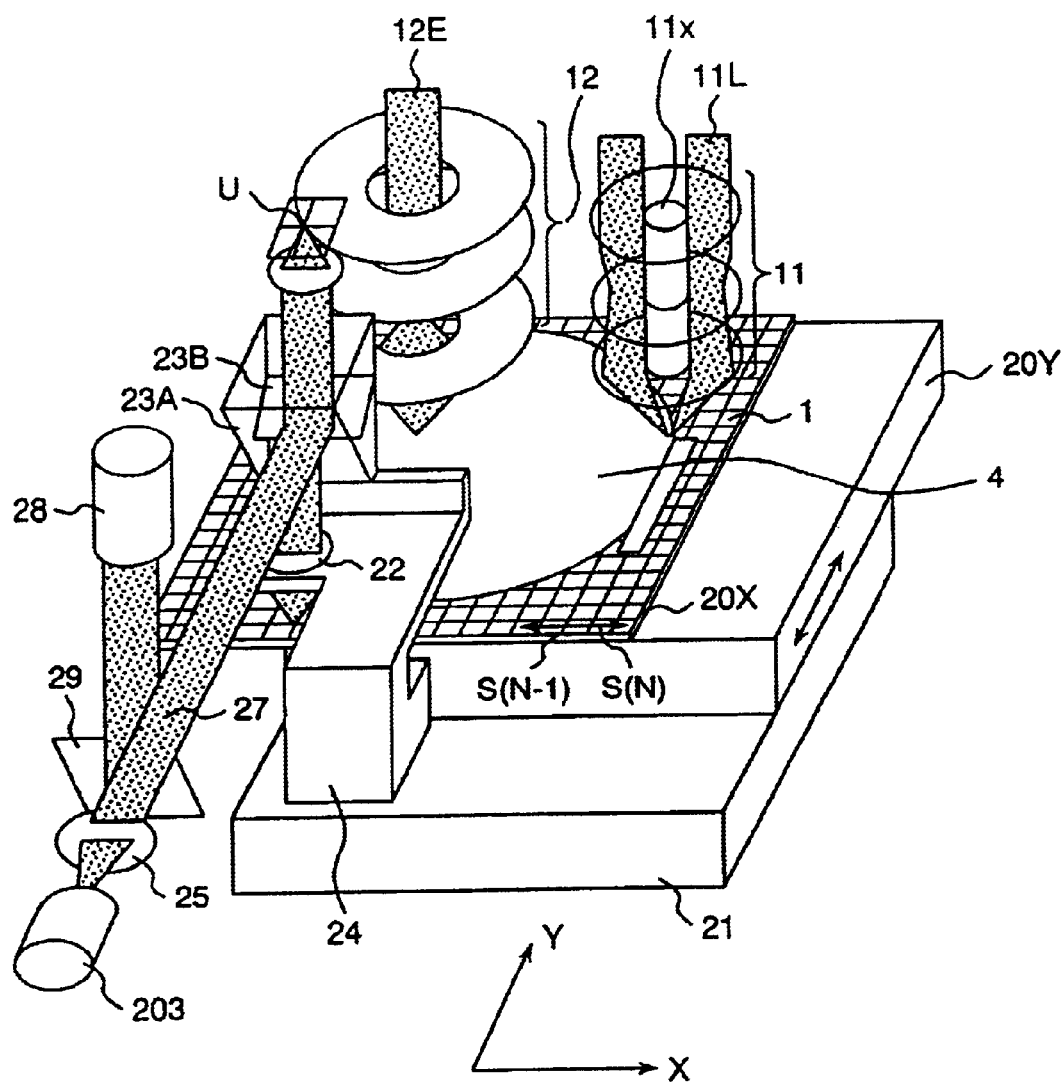
FIG. 4 is a perspective view for showing a principle portion of an apparatus structure according to a fourth embodiment.

In FIG. 4, showing the structure of the analysis and observation apparatus according to the present embodiment, a reference numeral 23A is a semi-transparent mirror, 23B a mirror, U a reference scale. Other structural elements shown in the figure are same to those in the second embodiment mentioned above, and are attached with reference numerals common with those shown in the FIG. 3 mentioned above.

According to the present embodiment, the semi-transparent mirror 23A and the mirror 23B are disposed in the place of the mirror 23 in the second embodiment mentioned above, in the optical system for use of scale observation, wherein both the scale divisions S(1)–S(N) and the reference scale divisions can be observed at the same time, by means of the camera 203 of the optical system for use of scale observation. The reference scale U is attached onto the holder jig 24 together with the objective lens 22, the semi-transparent mirror 23A and the mirror 23B.

For example, if the direction of the holder jig 24 is changed due to back-lash or looseness of the stage when the stage 20Y for use of Y-directional movement is driven, the observation light 27 is changed in the direction thereof, thereby shifting the position of image-formation on the video camera 26. Accordingly, if being left as it is, the position of observation upon the scale divisions S(1)–S(N) come down in the accuracy thereof.

Then, according to the present embodiment, for the purpose of prevention of the accuracy from lowering down, which is caused due to the shift in the direction of the holder jig 24 with respect to the Y direction mentioned above, the reference scale U is also can move on the video camera 26 together with the scale divisions S(1)–S(N) even when the holder jig 24 is changed in the direction thereof, thereby causing no change in a relative relationship between both of them. Thus, according to the present embodiment, the influences due to the shift in direction of the holder jig 24 can be cancelled with each other, therefore the positions of the scale divisions S(1)–S(N) can be measured, accurately.

According to the present embodiment, since the ill influences upon the holder jig 24 can be suppressed, which is caused due to the back-lash or looseness of the stages for use of movement, etc., therefore it is possible to achieve the positioning of the sample with higher accuracy.

A fifth embodiment of the present invention will be explained by referring to FIGS. 5 and 6.

According to the present embodiment, explanation will be given on steps for positioning the sample, in which the present invention is applied to. Herein, it is presumed that the analysis and observation apparatus has the same structure as of the fourth embodiment mentioned above.

In the steps for positioning according to the present embodiment, as shown in the flowchart shown in FIG. 6, first of all, a SEM image (i.e., a picture G) obtained by the electron microscope is memorized (in step 601), and then a distance Xs from the center of the optical system for scale observation to the scales is obtained (in step 602). FIG. 5(a) shows the condition where the sample is observed by means of the electron microscope. At the left-hand side confronting the paper surface is depicted the SEM image of the sample appearing within the field of view W1 of the electron microscope, while at the right-hand side, the images of the scale S(i) and the reference scale U appearing on the field of view of the optical system for use of scale observation. Herein, a case is considered where the S(i) and the U overlap each other before movement of the sample. However, it is presumed that plural numbers of foreign bodies 500 appear on the SEM image at the left-hand side in FIG. 5(a), which may be the targets of analysis by the laser mass spectrometer.

Next, the stage 20X for use of X-directional movement is moved until when k pieces of scale divisions pass by the position Xs of the optical system for use of scale observation (in steps 603–605). FIG. 5(b) shows the condition before conducting the positioning by means of the optical system for use of scale observation, although the sample is moved to the side of the micro-laser mass spectrometer. At the left-hand side in the figure is depicted an image of the sample appearing within the field of view W2 of the micro-laser mass spectrometer, while at the right-hand side the images of the scale division S(i+k) and the reference scale division U appearing in the field of view of the optical system for use of scale observation. In the present condition, it is presumed that, though the k pieces of scales pass by within the filed of view 3, from the condition shown in the FIG. 5(a), the scale division does not coincide with the reference scale division U.

Next, the stage 20X for use of X-directional movement is further driven until when the distance from the center of the optical system for scale observation up to the scale comes to Xs+jR (in steps 606 and 607).

FIG. 5(c) shows the condition after conduction of the positioning by means of the optical system for use of scale observation. The images at both sides are same to those shown in the FIG. 5(b).

Next, it is checked on whether the image observed by the optical observation device, which is provided in the laser mass spectrometer for specifying the region to be analyzed, is coincident with the SEM image (the picture G) obtained in the step 601 mentioned above or not (in step 608). When not being coincident with ("No" in the step 608), the stages 20X and 20Y for use of X- and Y-directional movements are driven (in step 609), on the other hand when being coincident with ("Yes" in the step 608), the foreign body 500 as the target is analyzed by the laser mass spectrometer (in step 610).

In FIG. 5(c) of the present embodiment, the scale division S(i+k) and the reference scale division U are coincident with, however the image observed within the field of view W2 is shown under the condition that it is not coincident with the SEM image within the field of view W1 shown in the FIG. 5(a).

When the both images or pictures are not coincident with, for example, the SEM image within the field of view W1 shown in the FIG. 5(a) and the image observed within the field of view W2 shown in the FIG. 5(c) are written into the image processing device, thereby making a comparison between a pattern, which is constructed with plural numbers of the foreign bodies 500a appearing on the image observed within the field of view W2, and a pattern of the foreign bodies 500 appearing on the SEM image within the field of view shown in the FIG. 5(a). By performing the comparison process between the two (2) patterns in this manner, it is possible to obtain the shift in position of the foreign body, and also by conducting the feedback of this to the stage 20X or 20Y for use of X- or Y-directional movement, it is possible to control the stage position, automatically, thereby bringing the both foreign bodies to be coincident with each other, in the positions thereof. FIG. 5(d) shows the condition after conducting the control operation for position mentioned above.

By the way, in general, the scale S(i) and the reference scale U do not necessarily overlap with each other, as was mentioned in the above, however the similar operation to that mentioned above can be made by measuring the relative position Xs between both of them.

In the present embodiment, the camera for use of sample observation of the micro-laser mass spectrometer may be one, which can be used for taking a picture for TV, and for example, it is possible to use a camera having a pixel number of 570(horizontal)×485 (vertical) and a pixel size of □20 $\mu$m. For making this one (1) pixel corresponding to 0.1 $\mu$m on the sample, a magnification of the optical system for observation is set to 200 times.

With this, R2 described in the equation (Eq. 3) mentioned above comes to be as follows:

$$R2=0.1\ \mu m \times 570 = 57\ \mu m \quad (Eq.\ 5)$$

Also, as the camera 26 of the optical system for use of scale observation, a camera is applied to, which is the same one of the camera of the micro-laser mass spectrometer. The focus distances both the objective lens 22 for use of scale observation shown in the FIG. 4 and the image-formation lens 25 are set to be 20 mm, thereby obtaining the resolving power of 20 $\mu$m.

This resolving power R and the R2 mentioned above satisfy the equation (Eq. 3) mentioned above.

Also, R0 comes to be as follows:

$$R0=20\ \mu m \times 570 = 11.4\ mm \quad (Eq.\ 6)$$

Then, the scale divisions are marked at a distance of 10 mm, thereby satisfying the equation (Eq. 1) mentioned above.

With the present embodiment, a series of control operations are automatized, as shown in the flowchart in FIG. 6, therefore it is possible to obtain the delivery of samples between the electron microscope and the micro-laser mass spectrometer, with high accuracy in positions, and also to obtain high speed and unmanned operation of the observation and/or analysis processing.

In the present embodiment, the shift between two (2) images is compensated, by using the patterns made up with the SEM image and the plural numbers of foreign bodies appearing on the image observed by the laser mass spectrometer, however the processing for compensating the shift between the two (2) images according to the present invention should not be restricted to it, but it may be constructed, so as to compensate the shift, by acknowledging the configuration of the respective foreign bodies or the targets to be analyzed, or by acknowledging wiring patterns on a wafer in the case where the sample is a semiconductor, for example.

Further, in the present embodiment are used the image or picture appearing on the scanning-type electron microscope and the optical image or picture observed by the laser mass spectrometer, however the images which can be used in the present invention should not be limited to those in the kinds thereof, and other kinds of images or pictures may be used if it is possible to acknowledge the positions of the targets to be analyzed, directly or indirectly, before and after the movement thereof. For example, here can be listed up the images or pictures obtained by a micro infrared spectrophotometer, a micro Raman spectrophotometer, a secondary ion mass spectrometer, an Auger electron spectrum analyzer, a focusing ion beam apparatus, and an X-ray micro-analyzer, etc.

According to the present invention, with the analysis and observation apparatus, combining means for conducting analysis and observation within a vacuum container in the plural numbers thereof, such as, the electron microscope and the micro-laser mass spectrometer, etc., wherein delivery and positioning of the samples can be performed between each analysis/observation means, with high accuracy and at high speed.

Further, according to the present invention, even in the case where a large number of samples are analyzed and observed in the vacuum atmosphere, the operation can be unmanned and automitized, thereby performing the analysis and observation processing in a short time.

What is claimed is:

1. An analysis and observation apparatus, having analysis/observation means for conducting analysis or observation on a sample in plural numbers thereof, for performing analysis or observation on said sample through said plural numbers of analysis/observation means, comprising:

a transfer means for moving the sample between said analysis/observation means; and a positioning means for positioning a specific position on said sample where a first analysis/observation means makes analysis or observation thereupon within a field of view of a second analysis/observation means, wherein said transfer means comprises a stage for use of movement in a direction for holding and moving said sample in a predetermined direction and a stage support portion for supporting said stage for use of movement in the direction, said positioning means comprises a scale provided on said state for use of movement and an optical system for scale observation, being fixed on a side of said stage support portion, and said scale has a unit provided at a distance less than a size of a field of view of said scale observation optical system, and a resolving power of said scale observation optical system is larger than a field of view of said analysis/observation means, thereby conducting positioning of said sample while monitoring said scale, which moves within the field of view of said scale observation optical system.

2. An analysis and observation apparatus, as described in claim 1, where said optical system for scale observation comprises an objective lens portion, being provided opposite to said scale, an image-formation portion for forming an image of said scale upon receipt of a light from said objective lens, and an image pickup portion for picking up an image of said scaled formed, wherein said objective lens portion is provided to be fixed on the side of said stage support portion, and said image-formation portion is provided to be fixed on a side of a housing container of said analysis and observation apparatus.

3. An analysis and observation apparatus, as described in claim 1, the direction is alone an X-axis wherein said first and said second analysis/observation means are disposed in parallel along with the X-axis, said stage support portion comprises a stage for use of movement in a Y-axial direction for moving said stage for use of movement in the X-axial direction on which said sample is mounted, in a direction of Y-axis orthogonal to said X-axis, while supporting said stage for use of movement in X-axial direction, and a basement for fixing said stage for use of movement in Y-axial direction on said analysis and observation apparatus, so as to be movable in said Y-axial direction, and said objective lens portion is provided, being fixed on the side of said stage for use of movement in Y-axial direction, so as to be moveable in said Y axial direction together with said sample, whereby a light from said objective lens to said image-forming portion is in parallel with said Y-directional direction.

4. An analysis and observation apparatus, as described in claim 1, wherein the direction is along an X-axis, further comprising:

a reference scale, being disposed to be fixed on the side of said stage for use of movement in Y-axial direction, and an optical system of forming an optical path for guiding an image of said reference scale, so that on said image pickup portion can be obtained a composite image of said reference scale and the image of the scale formed on said stage for use of movement in X-axial direction.

5. An analysis and observation apparatus, as described in claim 1, wherein, said positioning means further comprises a memory means for memorizing a picture, which is obtained by said first, analysis/observation means from said sample before movement thereof, and a picture, which is obtained by said second analysis/observation means from said sample after movement thereof, respectively, and a control means for controlling the positioning operation of said transfer means, by comparing said two (2) pictures memorized, so as to detect a shift in position of said sample appearing on both of said pictures, whereby bringing the positions of the sample appearing on the pictures to be coincident with each other by using a result of said detection.

6. An analysis and observation apparatus, as described in claim 1, wherein, said plural numbers of analysis/observation means are a scanning-type electron microscope and a laser mass spectrometer.

7. An analysis and observation apparatus, as described in claim 1, wherein said analysis and observation apparatus makes analysis or observation upon the sample within the vacuum chamber.

8. An analysis and observation apparatus, as described in claim 1, wherein each of said plural numbers of analysis/observation means uses any one of visible light, infrared ray, X-ray, electron and ion.

9. An inspection apparatus having a plurality of analysis/observation components for performing analysis or observation of a sample using said plurality of analysis/observation components, said apparatus comprising:

a transfer component to move the sample between said analysis/observation components; and a positioning component to associate a specific position on said sample where a first analysis/observation component makes analysis or observation thereupon within a field of view of a second analysis/observation means, wherein said transfer component comprises a stage for use of movement in a first direction for holding and moving said sample in a predetermined direction and a stage support portion for supporting said stage for use of movement in the first direction, said positioning component comprises a scale provided on said stage for use of movement and an optical system for scale observation, being fixed on a side of said stage support portion, and said scale has a unit provided at a distance less than a size of a field of view of said scale observation optical system, and a resolving power of said scale observation optical system is larger than a field of view of said analysis/observation component, thereby performing positioning of said sample while monitoring said scale, which moves within the field of view of said scale observation optical system.

* * * * *